United States Patent
Ulrich

(10) Patent No.: US 11,283,654 B2
(45) Date of Patent: Mar. 22, 2022

(54) MULTILEVEL DRIVER FOR HIGH SPEED CHIP-TO-CHIP COMMUNICATIONS

(71) Applicant: Kandou Labs SA, Lausanne (CH)

(72) Inventor: Roger Ulrich, Bern (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 17/037,054

(22) Filed: Sep. 29, 2020

(65) Prior Publication Data
US 2021/0014089 A1 Jan. 14, 2021

Related U.S. Application Data

(63) Continuation of application No. 16/559,412, filed on Sep. 3, 2019, now Pat. No. 10,791,008, which is a (Continued)

(51) Int. Cl.
| | | |
|---|---|---|
| H04L 25/03 | (2006.01) | |
| H04B 3/04 | (2006.01) | |
| H03K 19/0185 | (2006.01) | |
| H03K 19/00 | (2006.01) | |
| H04L 25/49 | (2006.01) | |

(52) U.S. Cl.
CPC ... H04L 25/03878 (2013.01); H03K 19/0013 (2013.01); H03K 19/0185 (2013.01); H04B 3/04 (2013.01); H04L 25/03133 (2013.01); H04L 25/03343 (2013.01); H04L 25/4917 (2013.01)

(58) Field of Classification Search
CPC ......... H04L 25/03878; H04L 25/03343; H04L 25/03133; H04L 25/4917; H03K 19/0013; H03K 19/0185; H04B 3/04; G11C 7/1057; G11C 29/023; G11C 29/028
See application file for complete search history.

(56) References Cited

U.S. PATENT DOCUMENTS

| | | |
|---|---|---|
| 4,373,152 A | 2/1983 | Jacobsthal |
| 5,334,956 A | 8/1994 | Leding et al. |
| (Continued) | | |

FOREIGN PATENT DOCUMENTS

| | | |
|---|---|---|
| CN | 101478286 A | 7/2009 |
| JP | S57129560 A | 8/1982 |

OTHER PUBLICATIONS

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

*Primary Examiner* — Dac V Ha
(74) *Attorney, Agent, or Firm* — Invention Mine LLC

(57) ABSTRACT

A plurality of driver slice circuits arranged in parallel having a plurality of driver slice outputs, each driver slice circuit having a digital driver input and a driver slice output, each driver slice circuit configured to generate a signal level determined by the digital driver input, and a common output node connected to the plurality of driver slice outputs and a wire of a multi-wire bus, the multi-wire bus having a characteristic transmission impedance matched to an output impedance of the plurality of driver slice circuits arranged in parallel, each driver slice circuit of the plurality of driver slice circuits having an individual output impedance that is greater than the characteristic transmission impedance of the wire of the multi-wire bus.

20 Claims, 7 Drawing Sheets

Related U.S. Application Data continuation of application No. 16/143,225, filed on Sep. 26, 2018, now Pat. No. 10,404,500, which is a continuation of application No. 15/918,851, filed on Mar. 12, 2018, now Pat. No. 10,091,033, which is a continuation of application No. 15/402,148, filed on Jan. 9, 2017, now Pat. No. 9,917,711, which is a continuation of application No. 14/829,388, filed on Aug. 18, 2015, now Pat. No. 9,544,015, which is a continuation of application No. 14/315,306, filed on Jun. 25, 2014, now Pat. No. 9,112,550.

(56) References Cited

U.S. PATENT DOCUMENTS

| | | |
|---|---|---|
| 5,539,360 A | 7/1996 | Vannatta et al. |
| 5,798,563 A | 8/1998 | Feilchenfeld et al. |
| 6,172,634 B1 | 1/2001 | Leonowich et al. |
| 6,772,351 B1 | 8/2004 | Werner et al. |
| 6,854,030 B2 | 2/2005 | Perino et al. |
| 7,085,336 B2 | 8/2006 | Lee et al. |
| 7,093,145 B2 | 8/2006 | Werner et al. |
| 7,123,660 B2 | 10/2006 | Haq et al. |
| 7,130,944 B2 | 10/2006 | Perino et al. |
| 7,145,411 B1 | 12/2006 | Blair et al. |
| 7,176,823 B2 | 2/2007 | Zabroda |
| 7,269,212 B1 | 9/2007 | Chau et al. |
| 7,336,139 B2 | 2/2008 | Blair et al. |
| 7,366,942 B2 | 4/2008 | Lee |
| 7,372,295 B1 | 5/2008 | Wei |
| 7,456,778 B2 | 11/2008 | Werner et al. |
| 7,462,956 B2 | 12/2008 | Lan et al. |
| 7,570,704 B2 | 8/2009 | Nagarajan et al. |
| 7,768,312 B2 | 8/2010 | Hirose |
| 7,826,551 B2 | 11/2010 | Lee et al. |
| 7,859,356 B2 | 12/2010 | Pandey |
| 8,040,200 B2 | 10/2011 | Minegishi et al. |
| 8,199,849 B2 | 6/2012 | Oh et al. |
| 8,284,848 B2 | 10/2012 | Nam et al. |
| 8,295,336 B2 | 10/2012 | Lutz et al. |
| 8,520,348 B2 | 8/2013 | Dong |
| 8,575,961 B2 | 11/2013 | Kojima |
| 8,649,445 B2 | 2/2014 | Cronie et al. |
| 8,782,578 B2 | 7/2014 | Tell |
| 8,975,948 B2 | 3/2015 | Gonzalez Diaz |
| 9,071,476 B2 | 6/2015 | Fox et al. |
| 9,112,550 B1 | 8/2015 | Ulrich |
| 9,300,503 B1 | 3/2016 | Holden et al. |
| 9,319,218 B2 | 4/2016 | Pandey et al. |
| 9,362,974 B2 | 6/2016 | Fox et al. |
| 9,544,015 B2 | 1/2017 | Ulrich |
| 9,710,412 B2 | 7/2017 | Sengoku |
| 9,917,711 B2 | 3/2018 | Ulrich |
| 10,091,033 B2 | 10/2018 | Ulrich |
| 10,243,614 B1 | 3/2019 | Ulrich et al. |
| 10,313,068 B1 | 6/2019 | Ahmed et al. |
| 2001/0006538 A1 | 7/2001 | Simon et al. |
| 2001/0055344 A1 | 12/2001 | Lee et al. |
| 2002/0075968 A1 | 6/2002 | Zerbe et al. |
| 2002/0125933 A1 | 9/2002 | Tamura et al. |
| 2003/0046618 A1 | 3/2003 | Collins |
| 2003/0085763 A1 | 5/2003 | Schrodinger et al. |
| 2004/0085091 A1 | 5/2004 | Brox |
| 2005/0134380 A1 | 6/2005 | Nairn |
| 2006/0092969 A1 | 5/2006 | Susnow et al. |
| 2006/0280259 A1 | 12/2006 | Alon et al. |
| 2007/0002954 A1 | 1/2007 | Cornelius et al. |
| 2007/0103338 A1 | 5/2007 | Teo |
| 2007/0121716 A1 | 5/2007 | Nagarajan et al. |
| 2008/0012598 A1 | 1/2008 | Mayer et al. |
| 2008/0175586 A1 | 7/2008 | Perkins et al. |
| 2009/0002030 A1 | 1/2009 | Stojanovic et al. |
| 2009/0237109 A1 | 9/2009 | Haig et al. |
| 2010/0046600 A1* | 2/2010 | Zerbe ................ H01L 21/76805 375/233 |
| 2010/0153792 A1 | 6/2010 | Jang |
| 2011/0156757 A1 | 6/2011 | Hayashi |
| 2011/0268225 A1 | 11/2011 | Cronie et al. |
| 2011/0299555 A1 | 12/2011 | Cronie et al. |
| 2011/0302478 A1 | 12/2011 | Cronie et al. |
| 2012/0020660 A1 | 1/2012 | Le et al. |
| 2012/0050079 A1 | 3/2012 | Goldman et al. |
| 2012/0125665 A1 | 5/2012 | Masuda |
| 2012/0133438 A1 | 5/2012 | Tsuchi et al. |
| 2012/0213299 A1 | 8/2012 | Cronie et al. |
| 2013/0249719 A1 | 9/2013 | Ryan |
| 2013/0307614 A1 | 11/2013 | Dai |
| 2014/0112376 A1 | 4/2014 | Wang et al. |
| 2014/0159769 A1 | 6/2014 | Hong et al. |
| 2014/0177699 A1 | 6/2014 | Tan et al. |
| 2014/0226734 A1 | 8/2014 | Fox et al. |
| 2014/0254712 A1 | 9/2014 | Lee et al. |
| 2015/0063494 A1 | 3/2015 | Simpson et al. |
| 2015/0331820 A1 | 11/2015 | Sengoku |
| 2015/0349835 A1 | 12/2015 | Fox et al. |
| 2015/0381232 A1 | 12/2015 | Ulrich |
| 2016/0134267 A1 | 5/2016 | Adachi |
| 2016/0373141 A1 | 12/2016 | Chou et al. |
| 2017/0302267 A1* | 10/2017 | Luo ................ H04L 25/03133 |
| 2017/0317449 A1 | 11/2017 | Shokrollahi et al. |
| 2017/0317855 A1 | 11/2017 | Shokrollahi et al. |
| 2017/0359211 A1* | 12/2017 | Dickson ................ H04L 27/364 |
| 2020/0313841 A1 | 10/2020 | Ulrich et al. |
| 2021/0051047 A1* | 2/2021 | Stojanovic ............ H04L 25/028 |

\* cited by examiner

MULTILEVEL DRIVER FOR HIGH SPEED CHIP-TO-CHIP COMMUNICATIONS

CROSS-REFERENCE TO RELATED APPLICATIONS

This application is a continuation of U.S. application Ser. No. 16/559,412, filed Sep. 3, 2019, naming Roger Ulrich, entitled "Multilevel Driver for High Speed Chip-to-Chip Communications", which is a continuation of U.S. application Ser. No. 16/143,225, filed Sep. 26, 2018, naming Roger Ulrich, entitled "Multilevel Driver for High Speed Chip-to-Chip Communications", which is a continuation of U.S. application Ser. No. 15/918,851, filed Mar. 12, 2018, naming Roger Ulrich, entitled "Multilevel Driver for High Speed Chip-to-Chip Communications", which is a continuation of U.S. application Ser. No. 15/402,148, filed Jan. 9, 2017, naming Roger Ulrich, entitled "Multilevel Driver for High Speed Chip-to-Chip Communications," which is a continuation of U.S. application Ser. No. 14/829,388, filed Aug. 18, 2015, naming Roger Ulrich, entitled "Multilevel Driver for High Speed Chip-to-Chip Communications," which is a continuation of U.S. application Ser. No. 14/315,306, filed Jun. 25, 2014, naming Roger Ulrich, entitled "Multilevel Driver Circuit for High Speed Chip-to-Chip Communications," all of which are hereby incorporated by reference in their entirety for all purposes.

REFERENCES

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication No. 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III");

U.S. Provisional Patent Application No. 61/753,870, filed Jan. 17, 2013, naming John Fox, Brian Holden, Peter Hunt, John D Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I");

U.S. Provisional Patent Application No. 61/763,403, filed Feb. 11, 2013, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox II");

U.S. Provisional Patent Application No. 61/773,709, filed Mar. 6, 2013, naming John Fox, Brian Holden, Peter Hunt, John D Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox III");

U.S. Provisional Patent Application No. 61/812,667, filed Apr. 16, 2013, naming John Fox, Brian Holden, Ali Hormati, Peter Hunt, John D Keay, Amin Shokrollahi, Anant Singh, Andrew Kevin John Stewart, and Giuseppe Surace, entitled "Methods and Systems for High Bandwidth Communications Interface" (hereinafter called "Fox IV");

U.S. patent application Ser. No. 13/842,740, filed Mar. 15, 2013, naming Brian Holden, Amin Shokrollahi, and Anant Singh, entitled "Methods and Systems for Skew Tolerance in and Advanced Detectors for Vector Signaling Codes for Chip-to-Chip Communication" (hereinafter called "Holden I");

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences" (hereinafter called "Ulrich I").

The following references are cited in this application using the labels set out in brackets:

[Kojima] U.S. Pat. No. 8,575,961, filed Oct. 13, 2009 and issued Nov. 5, 2013, naming Shoji Kojima, and entitled "Multi-Valued Driver Circuit".

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives signal or signals approximating those transmitted (as the result of signal degradation over the link, noise, and other distortions.) The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires required for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is 2^8, or 256. As with SES or DS links, output drivers used with a binary vector signaling code need only emit two distinct voltage- or current-levels, corresponding to the two possible coordinate values for each vector element.

With non-binary vector signaling, each component has a coordinate value that is a selection from a set of more than two possible values. A "non-binary vector signaling code" refers to a mapping and/or set of rules to map information bits to non-binary vectors. The corresponding output driver for a non-binary vector signaling code must be capable of emitting multiple voltage- or current-levels corresponding to the selected coordinate values for each vector output.

Examples of vector signaling methods are described in Cronie I, Cronie II, Cronie III, Fox I, Fox II, Fox III, Fox IV, and Holden I.

BRIEF DESCRIPTION

A transmitter and receiver can communicate using a serial communications link, wherein the serial communications link uses signaling based on a balanced vector signaling code. The vector signaling code transmits a vector of symbols using multiple wires of the communications link in each transmit unit interval. The number of components of the vector can be two, three, four, or more than four. The number of coordinate values for a component can be two, three, four, or more than four. For example, a link might use four components with four possible coordinate values: a high value, a low value, and inverses of the high and low values, such that a signal having the high value cancels out three signals having the inverse of the low value and a signal having the inverse of the high value cancels out three signals having the low value and, in this manner, the link can convey three bits in a signal period using those four components by mapping the eight possible three bit combinations onto the eight vector code words represented by the four permutations of one high value and three inverses of the low value plus the four permutations of the inverse of one high value and three low values. In a more specific embodiment, the high and low values are voltage values and relative to a reference, the high value and its inverse have the same magnitude but opposite signs, the low value and its inverse have the same magnitude but opposite signs, and the high value has a magnitude three times the low value. As another example, a different link might use three components chosen from three possible coordinate values: a positive value, a smaller positive value, and a smallest positive value or zero, such that the sum of all vector component values is a constant. Such a code is also balanced, albeit with an additional offset or DC component superimposed upon all possible coordinate values as is common practice in embodiments relying on single-ended power supplies.

In accordance with at least one embodiment of the invention, processes and apparatuses provide for transmitting data over physical channels to provide a high speed, low latency interface providing high total bandwidth at low power utilization, such as to interconnect integrated circuit chips in a multi-chip system. In some embodiments, different voltage, current, etc. levels are used for signaling and more than two levels may be used, such as a quaternary signaling system wherein each wire signal has one of four values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

DETAILED DESCRIPTION

Figure 1:
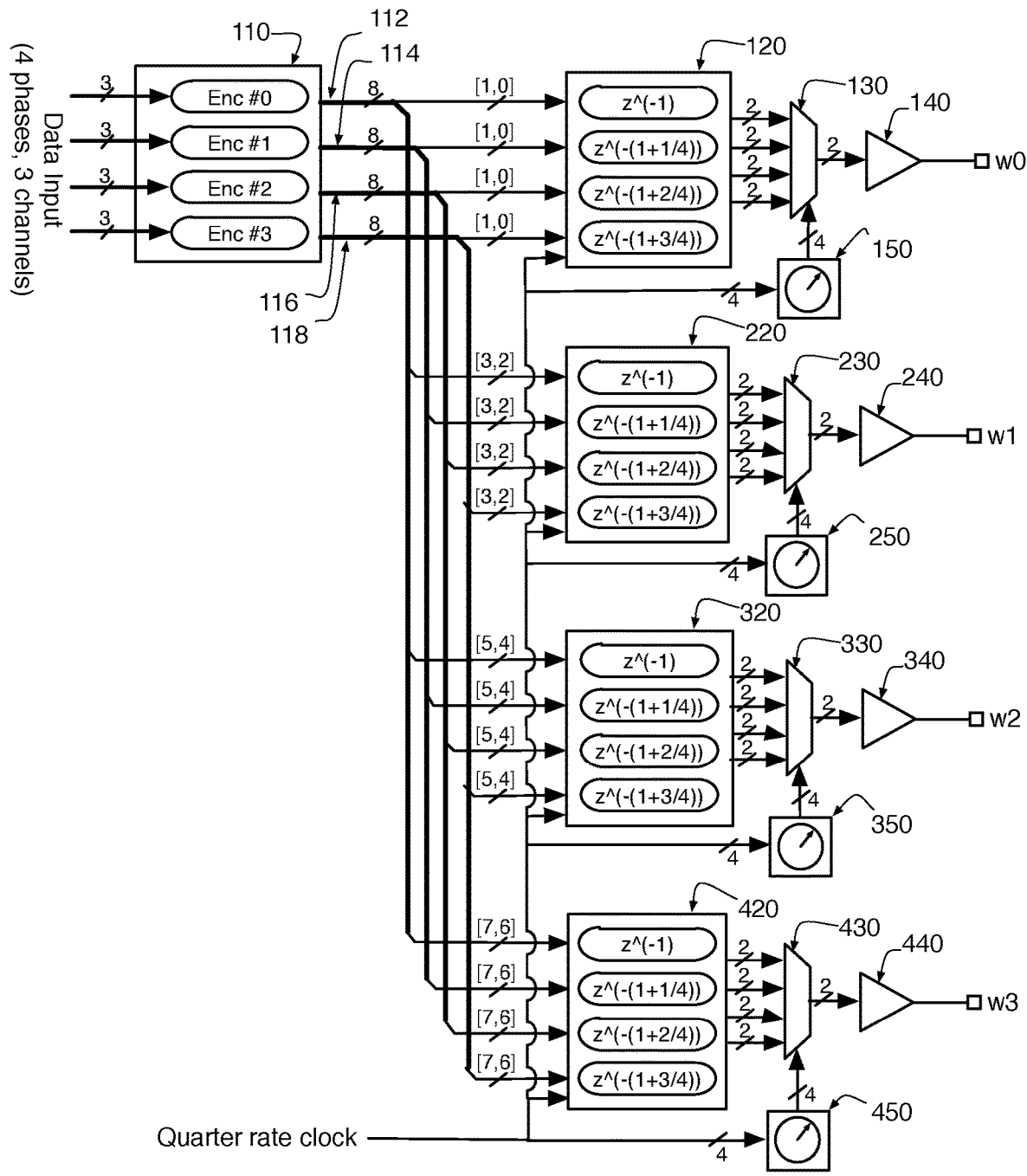
FIG. 1 is a block diagram of one embodiment of a four wire driver incorporating four processing phases.

Despite the increasing technological ability to integrate entire systems into a single integrated circuit, multiple chip systems and subsystems retain significant advantages. For purposes of description and without limitation, example embodiments of at least some aspects of the invention herein described assume a systems environment of (1) at least one point-to-point communications interface connecting two integrated circuit chips representing a transmitter and a receiver, (2) wherein the communications interface is supported by at least one interconnection group of four high-speed transmission line signal wires providing medium loss connectivity at high speed, (3) a vector signaling code carries information from the transmitter to the receiver as simultaneously transmitted values on each wire of a group with individual values being selected from four levels and, (4) the overall group is constrained by the vector signaling code to a fixed sum of levels.

Thus in one embodiment, symbol coordinate values of the H4 vector signaling code first described in [Cronie I] are transmitted as offset voltage levels from a fixed reference, as one example a +200 mV offset representing a "+1", a −66 mV offset representing a "−⅓", etc. At least one embodiment provides adjustment of transmission offset amplitudes so that the minimum levels appropriate to the desired receive signal/noise ratio may be used, minimizing transmission power.

Physical Channel Characteristics

For purposes of description and without limitation, a communications channel comprised of at least one group of, as a first example, four microstripline wires separated by a dielectric layer from a ground plane is assumed. The four wires of the group are routed together with homogenous fabrication characteristics, to minimize variations in attenuation and propagation velocity. It is further assumed that each wire in this channel is terminated at each end in its characteristic transmission line impedance. Thus, following conventional good practice for a typical transmission line impedance of 50 ohms, signals are issued by a transmitter having a source impedance of 50 ohms, and are detected at the receiver as voltages across or current through a 50 ohm termination resistance. As a second example, the group size is increased to six wires with all other characteristics as previously described. Increasing the group size enables the use of codes capable of communicating more information per wire (known as "pin efficiency",) at the cost of more complex routing and fabrication constraints to insure all wires of the group maintain the same transmission line characteristics.

Example signal levels, signal frequencies, and physical dimensions described herein are provided for purposes of explanation, and are not limiting. Different vector signaling codes may be used, communicated using more or fewer wires per group, fewer or greater numbers of signal levels per wire, and/or with different code word constraints. For convenience, signal levels are described herein as voltages, rather than their equivalent current values.

Other embodiments of the invention may utilize different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also explicitly in accordance with the invention.

H4 Code

Figure 7A:
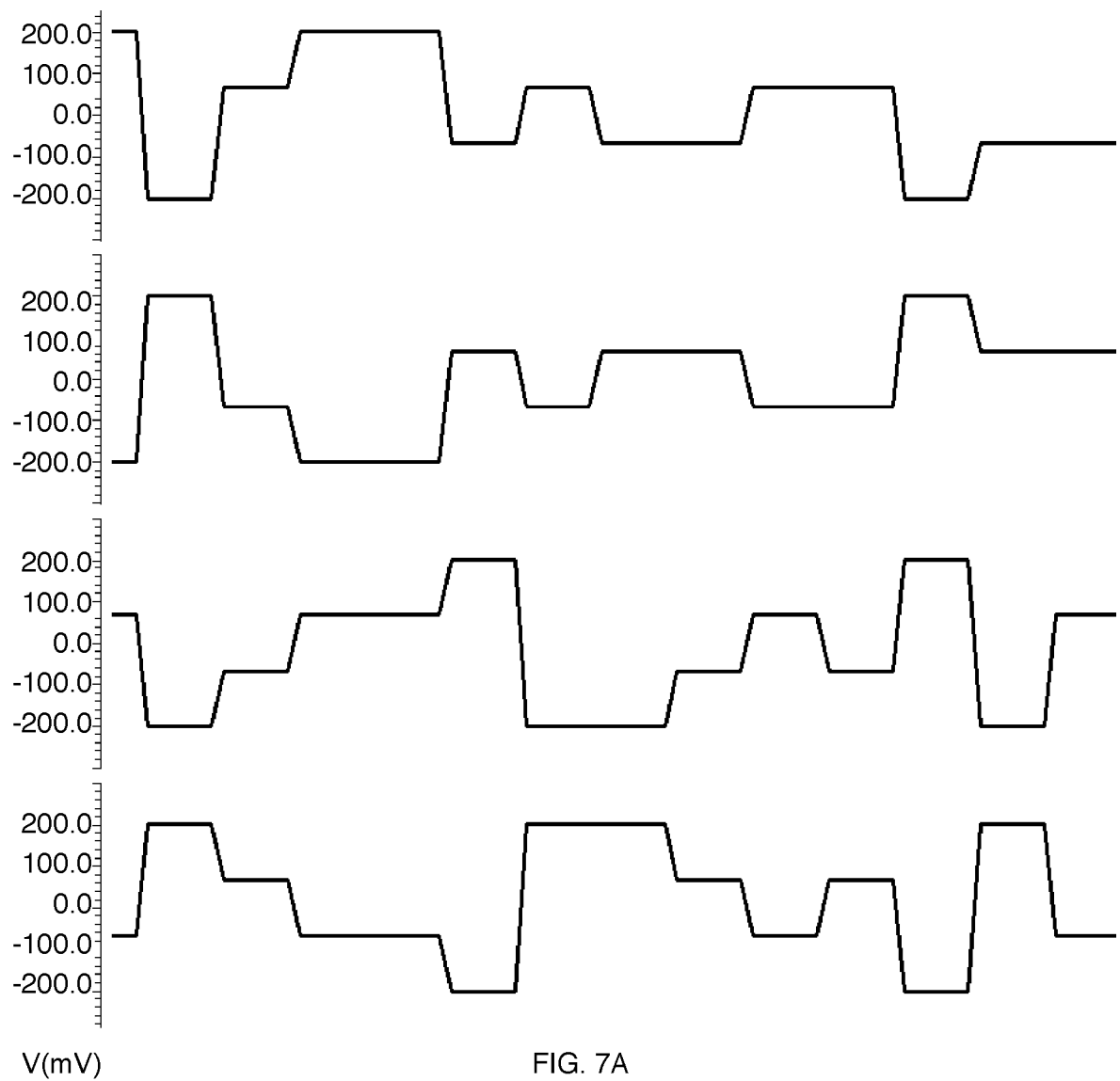
FIGS. 7A and 7B show individual wire signals of a transmitted H4 code and the combined signaling of all wires depicting the use of two of the four signal levels per transmit interval, in accordance with at least one embodiment of the invention.
Figure 7B:
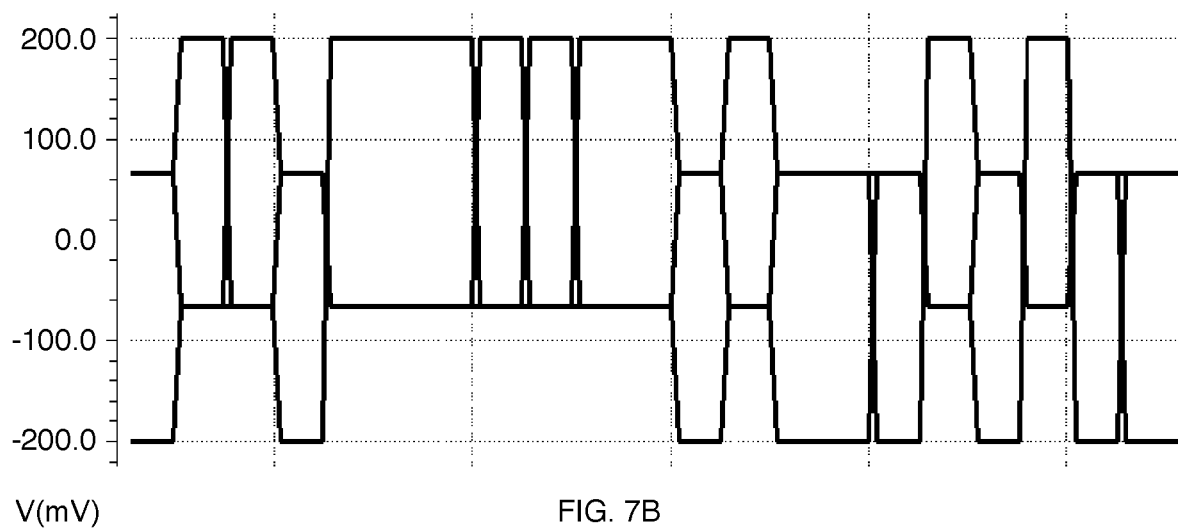

As used herein, "H4" code, also called Ensemble NRZ code, refers to a vector signaling code and associated logic for such code wherein a transmitter consumes three bits and outputs a series of signals on four wires in each symbol period. In some embodiments, parallel configurations comprising more than one group may be used, with each group comprising three bits transmitted on four wires per symbol period and an H4 encoder and an H4 decoder per group. With an H4 code, there are four signal wires and four possible coordinate values, represented herein as +1, +⅓, −⅓, and −1. The H4 code words are balanced, in that each code word is either one of the four permutations of (+1, −⅓, −⅓, −⅓) or one of the four permutations of (−1, +⅓, +⅓, +⅓), all such permutations summing to the equivalent of a zero value. H4 encoded signal waveforms for four wire outputs are shown in FIG. 7A. It should be noted that although the constellation of all code words utilizes four distinct signal levels, only two signal levels will be utilized in any one code word, as is illustrated by a superposition of all four signal waveforms, as shown in FIG. 7B.

In a specific embodiment, a +1 might be sent as a signal using an offset of 200 mV, while a −1 is sent as a signal using an offset of −200 mV, a +⅓ is sent as a signal using an offset of 66 mV, and a −⅓ is sent as a signal using an offset of −66 mV, wherein the voltage levels are with respect to a fixed reference. Note that the average of all of the signals sent (or received, disregarding asymmetric effects of skew, crosstalk, and attenuation) in any single time interval regardless of the code word represented is "0", corresponding to the fixed reference voltage. There are eight distinct code words in H4, which is sufficient to encode three binary bits per transmitted symbol interval.

Other variants of the H4 coding described above exist as well. The signal levels are given as examples, without limitation, and represent incremental signal values from a nominal reference level.

5b6w Ternary Code

Another vector signaling code herein called "5b6w" is designed to send on a group of six wires 2 "+" signals, 2 "−" signals, and 2 "0" signals. This code is thus "balanced", having the same number of "+" values as "−" values per group, allowing each code to sum to a constant value of zero. A knowledgeable practitioner may note that without additional constraint, a code based on sending 2 "+" signals and 2 "−" signals on every group of 6 wires has 90 distinct combinations, sufficient to encode 6 bits instead of 5. However, as fully described in [Fox III], a subset of 32 code words is used to encode 5 binary bits, with a significantly simplified receiver.

The examples in [Fox III] combine the 5b6w code with an output driver structure optimized to generate three distinct output voltages on a high-impedance CMOS-compatible interconnection with very low power consumption. Examples herein illustrate the combination of 5b6w code and ternary signal levels with output drivers optimized for use with matched impedance terminated transmission lines.

Multiphase Processing

Figure 3:
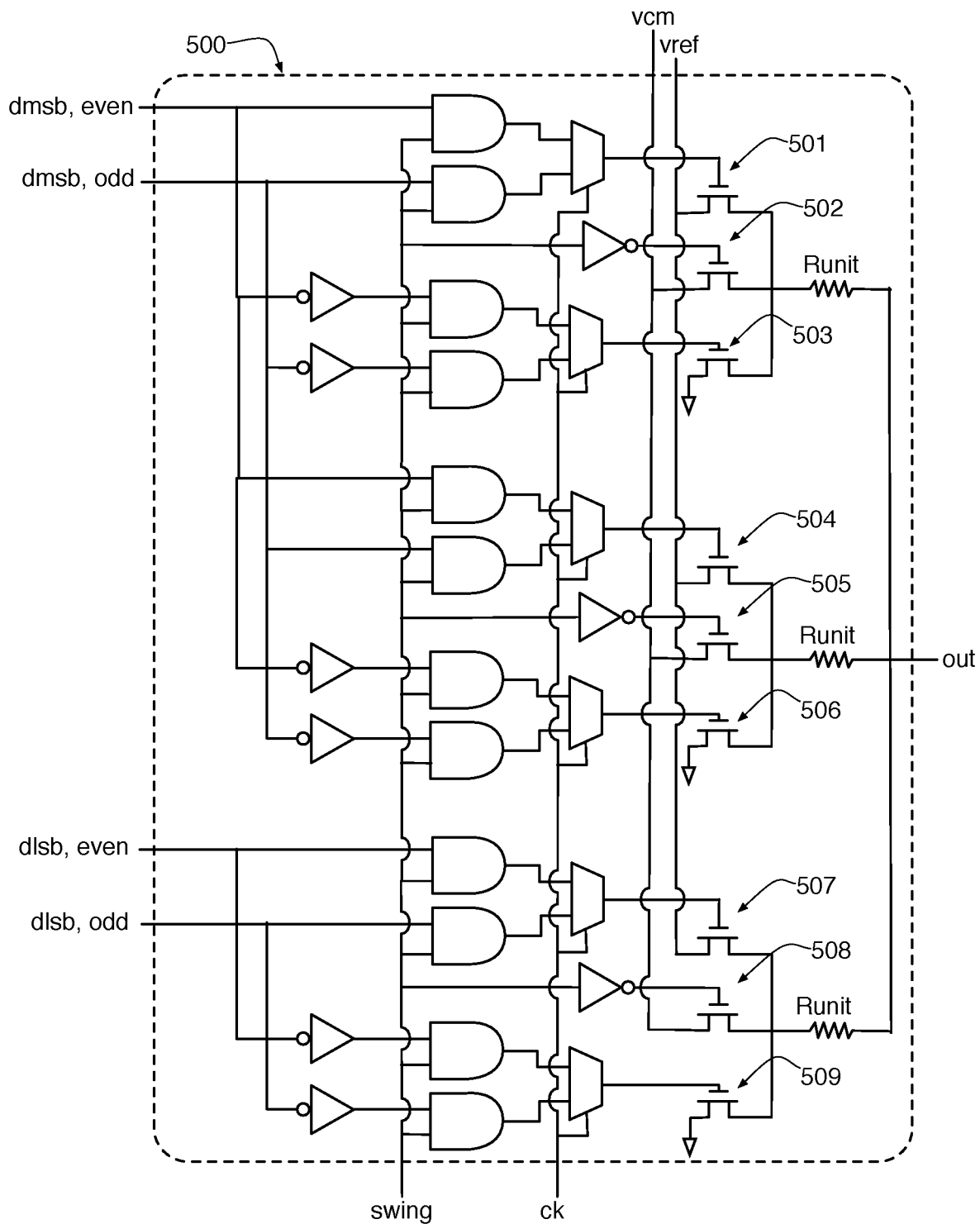
FIG. 3 is a schematic of an output line driver subsystem incorporating two processing phases, and suitable for use in a multi-slice embodiment.
Figure 4:
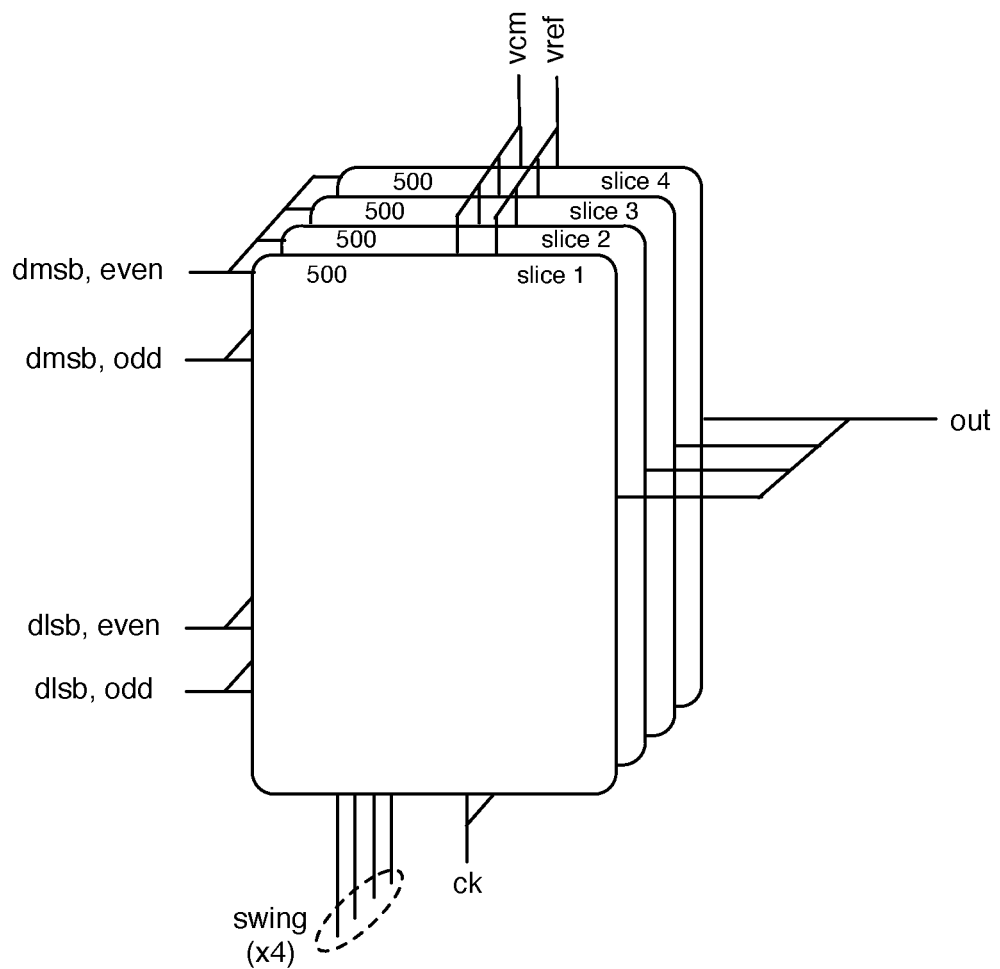
FIG. 4 is an embodiment of a multi-slice single wire driver utilizing multiple instances of the subsystem of FIG. 3.
Figure 5:
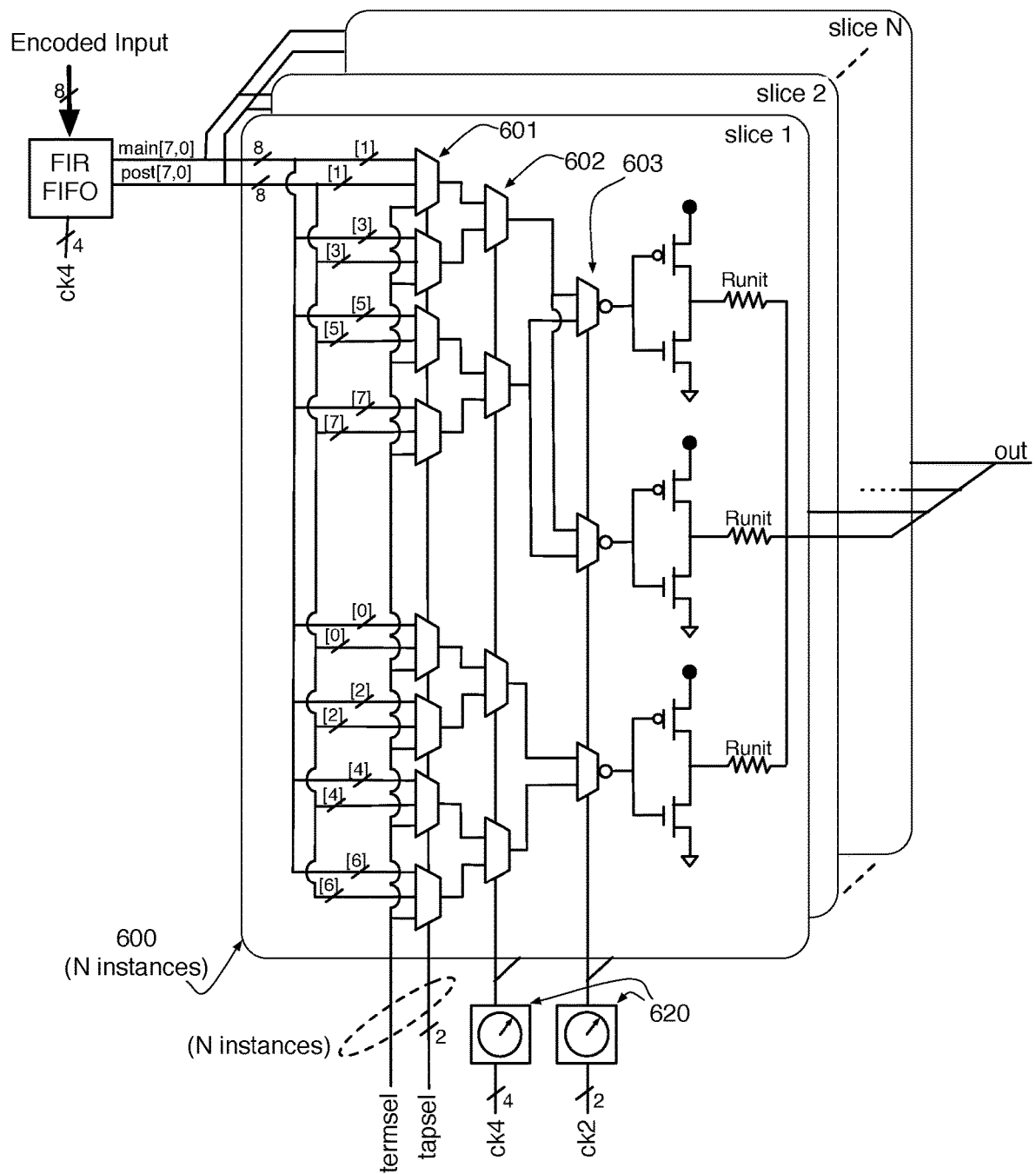
FIG. 5 is a block diagram of one embodiment of a multi-slice single wire driver incorporating four phases of processing and transmit pre-compensation.
Figure 6:
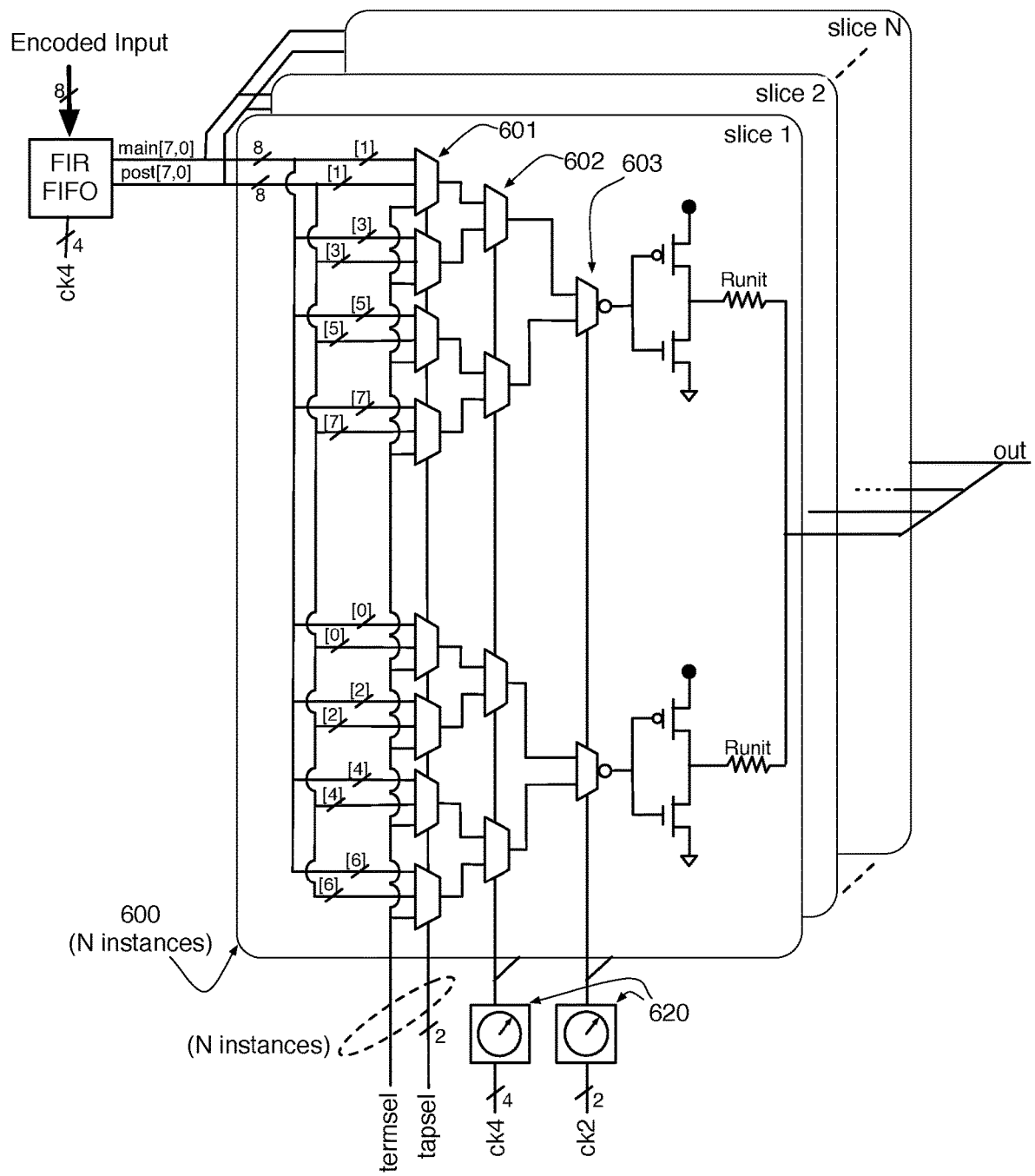
FIG. 6 is a block diagram of another embodiment of a multi-slice single wire driver incorporating four phases of processing and transmit pre-compensation.

High-speed communications embodiments often exceed the performance capabilities of a single communications circuit instance, thus rely on parallel processing or pipelined processing techniques to provide higher throughput. As examples presented without implying a limitation, FIG. 1, FIG. 5, and FIG. 6 illustrate embodiments providing four processing phases each operating at one quarter the wire unit interval transmission rate which are interleaved to produce the final wire rate transmission sequence, and FIG. 3 and FIG. 4 show embodiments having two processing phases operating at one half the wire interval transmission rate which are interleaved to produce the final wire rate output sequence. Any number of phases may be used in a particular embodiment, from a single phase performing all operations, to sixteen or more parallel processing phases, with each of such multiple phases possibly also extending over a greater or lesser portion of the described transmission system than shown by these examples.

Example H4 Driver

FIG. 1 is a block diagram representative of at least one embodiment of the invention. As previously mentioned, this example incorporates four phases of encoder logic 110 each operating at one quarter of the transmit clock rate, the outputs of which are subsequently interleaved to produce the final transmitted data stream. For purposes of description, a transmit output stream unit interval of 62.5 picoseconds, corresponding to a transmission rate of 16 Gigasymbols/second is assumed. Thus, each phase of the Quarter-rate clock operates at 4 GHz, and each encoder has 250 ps of processing time per cycle.

As the H4 code encodes three binary bits in each four symbol codeword, the Data Input consists of three bits of data for each of four parallel processing phases. Thus, a total of 12 input bits are processed for each four transmit intervals. Encoder 110 contains four distinct instances of encoding logic, each mapping three binary data input bits into four symbol values. As each of the four symbols can take on one of four coordinate values (thus requiring two binary output bits per symbol), each encoder output 112, 114, 116, 118 is eight bits.

Transmit pre-drivers 120, 220, 320, and 420 each have a digital driver input that accepts encoder output values corresponding to one symbol of the codeword, and prepares it to be output on one wire, w0, w1, w2, and w3 respectively. As an example, the two least significant bits of encoder output (that is, the coordinate value for the least significant symbol of the code word vector) are received and processed by 120, which maps the selected symbol value into a result selecting a particular wire signal value representing that signal value. Multiplexer 130 then interleaves the four phases of results into a single output stream which multilevel output line driver 140 transmits on wire w0. The timing of the output signal may be adjusted using phase compensator 150, introducing an adjustable phase delay between the quarter rate clock signals and the output driver. This adjustable delay may provide pre-compensation for propagation time differences on individual wires, as part of an overall skew compensation solution. In one exemplary embodiment, the range of adjustment spans approximately one quarter-rate clock interval, less any required set up, hold, and/or fall through time for data latches in the encoder signal path between encoder and output. Using the specific example of a 62.5 picosecond transmit unit interval, an adjustment range of 90 degrees of the quarter-rate clock corresponds to a skew pre-compensation of up to 62.5 ps, which is equivalent to approximately 12 mm of differential path length for transmission lines on common backplane materials.

Multilevel Output Line Driver

Figure 2A:
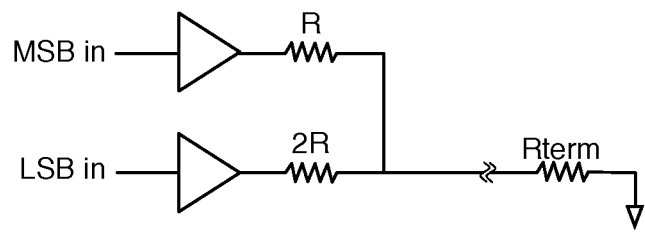
FIGS. 2A through 2D are schematics showing respective embodiments of a multi-level output line driver.

Operation of the multilevel output line driver (as in FIG. 1's 140, 240, 340, 440) is illustrated in FIGS. 2A through 2D. The line driver uses a conventional CMOS complimentary pair, stacked pair, or source follower output driver for each significant bit of output resolution, and resistive analog summing of the significant bit outputs to the final output result. Thus, as shown in FIG. 2A, one embodiment of a four level (two bits of coordinate selection) driver uses two output stages, each driving the common load of the transmission line impedance Rterm through a different source impedance to obtain distinct output levels. The MSB driver source impedance R is one half that of the LSB driver source impedance 2R, thus will have twice the effect on the output voltage. In a practical embodiment, the parallel combination of R and 2R matches transmission line impedance Rterm to provide correct source termination resistance. Thus, if the transmission line impedance is 50 ohms, matched source impedance is achieved in FIG. 2A when R is 75 ohms and 2R is 150 ohms.

Figure 2B:
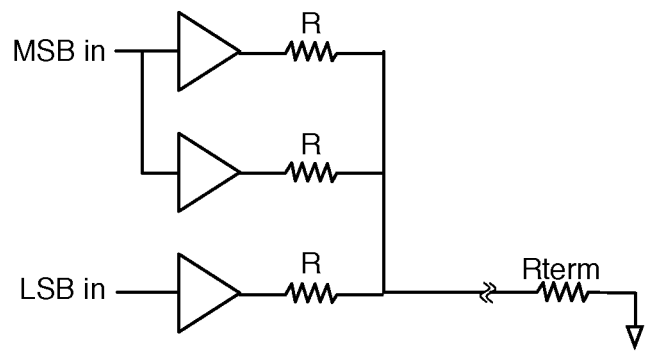

As is well known to one familiar with the art, it is relatively simple to ratiometrically match resistor values on-chip. However, if the impedances R and 2R are to be selected, trimmed, or adjusted to accurately incorporate the internal impedance of the driver transistors as well, it becomes significantly more difficult to design such R/2R structures. The alternative embodiment of FIG. 2B uses duplicated driver elements to significantly simplify matching, while maintaining the binary weighting among the various data bits of the previous embodiment. In FIG. 2B, all impedance R values are identical, with the parallel combination of the three R impedances in FIG. 2B matching Rterm. Thus, for the example 50 ohm impedance, each R would be 150 ohms (including the effective impedance of its drive transistors.) Reliance on multiple identical-value resistors and multiple identical-characteristic transistors is well recognized as an advantageous practice in integrated circuit design. For example, [Kojima] describes a multi-level output driver circuit incorporating multiple paralleled output drivers and same-value resistors where each control input manipulates a binary weighted number of drivers and resistors to drive an output to multiple desired voltage levels, in a manner comparable to that shown in the present application's FIG. 2B. [Kojima] also describes use of a R/2R resistive ladder network to obtain comparable multi-level output levels, such ladder structures being well known in the art.

Figure 2C:
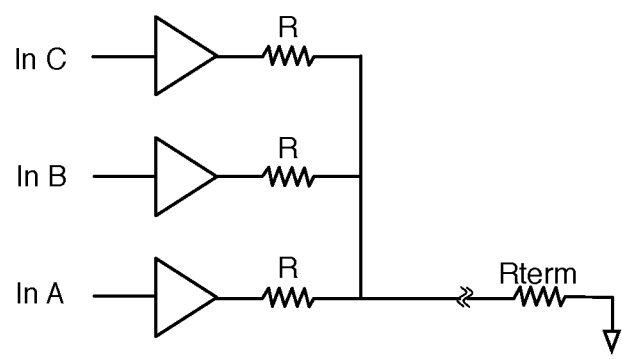

An alternative embodiment, shown as FIG. 2C, utilizes unary rather than binary weighting. Where the previous embodiments obtain an output level of "2" by enabling MSB in and disabling LSB in, an additive unary driver such as that of FIG. 3 requires any two of inputs In A, In B, or In C to be enabled. Thus, if FIG. 2A may be described as utilizing binary additive analog summing of the MSB and LSB values, FIG. 2B may be described as utilizing unary additive analog summation of a first and a second data values.

Figure 2D:
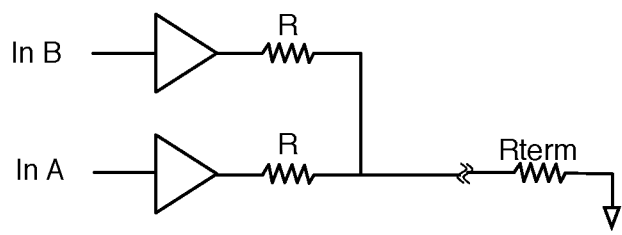

One familiar with the art will observe that these examples may also be directly utilized for three level (ternary) signaling such in the 5b6w code or indeed for two-level (binary) signaling, and may readily be extended by addition of additional resistors and driver elements to higher-order signaling as well. Similarly, simplifying the circuit of FIG. 2C to create the circuit of FIG. 2D is sufficient for embodiments using no more than ternary signaling.

FIG. 3 shows a schematic diagram of an output driver subsystem incorporating the technique of FIG. 2B and using two phase (i.e. half transmit output clock rate) input processing. The two phases of input data provided to the digital driver input of the driver slice 500 are "even" and "odd", with multiplexers controlled by clock ck interleaving the even and odd signals into the combined output stream. The MSB portion of the input data controls two paralleled output transistors 501/502/503 and 504/505/506, while the LSB portion controls single output transistors 507/508/509. The Boolean logic decodes the state of the data bit, with an input "1" enabling transistors 501 and 504 for the MSB, or 507 for the LSB, connecting the Runit resistors to positive voltage Vref, resulting in a positive output offset. An input "0" enables transistors 503 and 506 for the MSB, or 509 for the LSB, connecting the Runit resistors to Vdd, resulting in a negative output offset. As with the example of FIG. 2B, the voltage switching circuitry (501/502/503 or 504/505/506) for the MSB driving two Runit resistors results in twice the effect on the output wire, relative to the voltage switching circuitry (507/508/509) for the LSB driving one Runit resistor.

Control signal "swing" may be deasserted to disable both "1" and "0" outputs, allowing transistors 502, 505, and 508 to drive resistors Rterm to the constant voltage node vcm, the common mode or idle voltage value.

Multiple Output Driver Slices

One familiar with the art may observe that implementing on-chip resistors of the low values appropriate to the circuits of FIGS. 2A through 2D and FIG. 3 is problematic, as a typical sheet resistance available in a semiconductor process is 800-900 ohms/square. Thus, a resistor of even 150 ohm value would require an unacceptable length:width ratio of 2:11. Moreover, the correspondingly low on-resistance (i.e. on the order of tens of ohms) required in the output transistors would make them unacceptably large.

Similarly, the teachings of [Kojima] do not address the issues of drive transistor impedance (i.e. physical device size on the integrated circuit die) or achieving both accurate and implementable low value resistors in an integrated circuit embodiment.

FIG. 4 illustrates multiple instances of FIG. 3's output driver subsystem controlling a single output wire. Each of the four instances of 500, respectively labeled slice 1-4, are in parallel except for control inputs "swing". Thus, if "swing" is enabled only to slice 1, only its drivers will contribute to generating offset voltages for coordinate data, with slices 2, 3, and 4 providing only resistive connections from "out" to vcm.

Enabling additional slices in parallel scales the resulting output offsets linearly if all values of Runit are identical on all slices, as the output value seen at common output node "out" is controlled by the arithmetic sum of each incremental offset produced by each slice. This unary slicewise addition permits the output swing to be adjusted to four distinct values with four slices. This parallel slice approach also permits a significant increase of the ratio of Runit to Rterm. With the example four slices, the required resistance of each individual output resistor or other resistive element for all slices operating in parallel driving the example 50 ohm line impedance increases to 600 ohms. With forty such slices, the required resistor value increases to 6000 ohms, which may be obtained, as one example, by combining an easily-implemented 5400 ohm on-chip resistor with reasonable 600 ohm drive transistor impedance. The identical and repetitive design of the multiple slices allows for simple layout and consistent results. Thus, this approach allows significant benefits to integrated circuit implementation.

One might observe that scaling the resistive values of resistive elements (i.e. Runit values) on different slices would allow broader adjustment range; as one example, binary scaling (e.g. making the resistance element values on slice 2 one half those on slice 1, etc.) would allow four slices to provide 16 distinct scaled output swings. However, as with the example of FIG. 2A, such as scheme will have issues maintaining accurate ratiometric matching, potentially resulting in non-monotonic adjustment results for the resulting assembly. Such a weighted solution also does not address the implementation issues associated with low-value resistances and transistor impedances in the more-significant (i.e. lower R ratio) output slices. Thus, a preferred embodiment of a low impedance transmission line driver utilizes larger numbers of identical slices that are combined via unary addition.

Multi-Slice Output Driver with Transmit Equalization

Expanding upon the previous examples, FIG. 5 shows a set of N output driver slices operating concurrently to drive an output wire. Each output driver slice 600 is comprised of a high-speed 4:1 digital mux for each of the MSB and LSB output control bits, combining the four encoded data phases into a full rate output stream driving three identical line drivers, two for the MSB and one for the LSB, producing a single output. In this example, the high-speed 4:1 mux is implemented as two stages of 2:1 multiplexing, with elements 602 being a representative element of the first stage, and 603 being a representative element of the second stage. Similarly, for purposes of illustration this example shows a CMOS line driver used to drive each Runit resistive element.

In FIG. 5, the high-speed 4:1 mux is preceded by an input selection mux or pre-driver switching circuit (of which 601 is an example element,) allowing selection of a driver input source from the main[ ] or post[ ] input busses, or from the termsel inputs. Thus, appropriate configuration of the tapsel control signal inputs to any given slice allows that slice to be dedicated to a main stream of symbol values labeled main[ ], a delayed stream of symbol values labeled post[ ], or emission of a fixed output value as represented by the termsel input. The termsel inputs thus provide a quiescent input that, when selected, produce a fixed output value, such as a fixed output voltage.

In one example embodiment, such slice assignment is determined as part of a configuration or initialization procedure, thus the tapsel input selection mux control signals and/or termsel input will typically change only occasionally or infrequently, compared to the output data rate. Depending on layout constraints and system design preferences, the illustrated signal inputs termsel and tapsel controlling a data slice from a centralized configuration system may be replaced by distributed control registers or distributed control processors or state machines performing a comparable function for each slice or subset of slices Assignment of different numbers of slices to the same input allows control of that input's relative output levels. As an example, if forty slices are configured for input from main[ ] to provide a main series of signal levels, the total output swing at the wire output "out" will be Vdd*Rterm/((Runit/40*3)+Rterm) and may be reduced by increments of 2.5% ($\frac{1}{40}^{th}$ of that total) by configuring a portion of those slices to output a fixed output value (as one example, Vss) rather than data. The quiescent voltage level of the output may be adjusted by selection of different fixed output values for some or all of the non-data slices.

Thus, appropriate assignment of a first number of slices to a data input permits control of the output signal amplitude, while assignment of a second number of slices to a fixed signal input permits control of the output signal bias or offset level. As the aggregate driver output impedance is a function of the number of Runit values in parallel across all output drivers and slices, the source impedance facing the communications channel may also be adjusted based on the number of slices actively driving that output. Other slices may be placed in a tri-state or high impedance mode with the use of disabling circuitry. Disabling circuitry may include, for example, a switch that disconnects a slice output from the common output node, or it may include within the voltage switching circuitry a transistor operative to connect the slice output to a high impedance node instead of to a constant-voltage source. Disabling selected slices serves to increase the output impedance of the signal generator and can be used to match the impedance of transmission lines.

Finite Impulse Response Equalization

Frequency equalization, waveform control, and other pre-compensation for communications channel anomalies such as reflections and inter-symbol interference (ISI) may be implemented in a transmission line driver using Finite Impulse Response (FIR) filtering techniques.

A FIR filter represents the desired frequency-based or waveform-based signal in the time domain, specifically as a weighted sum of N signal values over time. For a transmitter, the N signal values identify N chronologically consecutive signal values, such as the value being output during the present transmission unit interval (UI) and N-1 values representing outputs in chronologically preceding or following transmission unit intervals. As an example, one FIR embodiment may combine weighted values representing two preceding, the current, and three following unit intervals.

The multiple slice architecture of the present invention lends itself to a simple and efficient FIR embodiment. As previously described, the number of slices assigned to output a main series of signal levels controls the amplitude of the resulting output signal, corresponding to a scaling or multiplicative weighting of the signal output. Similarly, assignment of different slices or groups of slices to different functions, such as a delayed series of signal levels or an advanced series of signal levels, produces an equalized output signal corresponding to the sum of the slice outputs, components of that sum being weighted by the number of slices in each group.

A signal generator may comprise an equalization circuit that processes the input to the driver slices. One such equalization circuit is the FIR FIFO (first-in-first-out) circuit of FIG. 5, which includes a clocked delay line allowing access to data chronologically preceding or following the current transmit data for purposes of transmit equalization, such as provided by a Finite Impulse Response filter. Depending on the desired delay amount and process capabilities, circuitry such as cascaded latches, digital shift register, FIFO register file, or a FIFO circular loop buffer may be used as the digital delay element.

The FIR FIFO may also incorporate data alignment functions supporting a multi-phase processing architecture, for example allowing an input stream of data aligned to one clock phase to be properly timed for use in outputting a different clock phase's data. Such data alignment functions are well known to those familiar with the art, and allow a wide input data word as represented by the input stream labeled "Encoded Input" in FIG. 5 to be accepted based on, as one example, quarter rate clock phase 0, while outputting four narrower data words individually timed to the phase 0, phase 1, phase 2 and phase 3 output intervals represented by the various combinations of clk4( ) and clk2( ) signals to each driver output mux, with tap delays available in increments of one unit interval. To facilitate understanding, the FIR FIFO function may also be interpreted as an equivalent "black box" comprised of a simple single-phase narrow FIFO operating at the full UI clock rate, with individual output taps that are then retimed using latches to be synchronous to the appropriate output clock phase required.

As one example and without limitation, FIG. 5 shows the FIR FIFO accepting an Encoded Input stream of 8 bits, corresponding to two bits of coordinate selection information from each of four encoder processing phases, and deriving a main tap output of transmit data (2 bits per symbol for each of four phases) labeled as main[7,0] and one delayed tap output representing chronologically-offset transmit data labeled as post[7,0]. If, continuing the example, six slices are assigned to post[ ] and forty slices are assigned to main[ ], the chronologically-offset signal represents 15% of the main output signal, a typical amount of pre- or post-emphasis for transmit equalization or ISI elimination. One familiar with the art will note that both the overall signal amplitude and the weighted equalization amount may be adjusted by selection of different numbers of slices assigned to generate the main series of signal levels versus the delayed series of signal levels and/or the advanced series of signal levels.

The necessary adjustment information may be obtained by external testing of the signal paths, or through feedback of receiver information to the transmitter via a return channel.

As one familiar with the art will recognize, the weighting factors used in a FIR embodiment generally consist of one positive term (for the on-time or current unit interval component) and multiple negative terms corresponding to earlier or later unit interval components. One embodiment hardwires tap polarities based on these anticipated FIR parameters, as one example providing main tap outputs that are non-inverted and advanced taps and/or delayed tap outputs that are inverted. Another embodiment provides the ability to select either inverted or non-inverted FIR FIFO tap data by, as one example, introduction of digital inverting circuitry such as an XOR element into some or all FIR FIFO tap output paths.

One further embodiment extends the architecture of FIG. 5 by incorporating additional FIR FIFO taps, additional input multiplexer selection options, and larger numbers of slices to support more complex FIR transmit equalization with adjustable output amplitude and offset voltage. Another such embodiment allocates up to seven slices to advanced stream of symbol values provided by advanced taps, up to forty slices to the main stream of symbol values provided by the main tap, and fifteen slices to a delayed stream of symbol values provided by delayed taps, for each wire output. Additional slices (and any slices not in active use) may be configured as quiescent driver slices to provide a quiescent or baseline output voltage, or may optionally be set to an inactive or high impedance state, incrementally increasing the effective transmit impedance should that be required to better match the transmission line characteristics. Alternate embodiments utilizing output driver structures as shown in FIG. 3 may similarly select termination to constant-voltage nodes such as vcm, termination to gnd, termination to vref, or other nodes such as a high impedance node, or active data output as configurable slice behaviors.

The embodiment illustrated in FIG. 5 shows each slice having input multiplexers 601 allowing any slice to output main, delayed, or termination levels. Other embodiments may incorporate wider input multiplexers, allowing slices to select, as one example, data from additional FIR FIFO taps. Alternative embodiments may simplify the input multiplexers on some or all slices, to dedicate those slices to particular or more limited ranges of functions or sets of taps. This simplification may reduce power consumption and/or circuit loading, by eliminating circuit elements not actively utilized in a particular application.

Depending on the number of output levels required to represent the encoded signals, fewer or more output multiplexers, driver transistors, and series resistors may be required per slice, and fewer or more Encoded Input bits may be provided to each driver to select such levels. For purposes of illustration, FIG. 5 shows these elements structured as described in FIG. 2B. Other embodiments such as shown in FIG. 6 may structure these same elements as described in FIG. 2C or FIG. 2D.

Skew Compensation

As described in association with FIG. 1, embodiments as in FIG. 5 and FIG. 6 may incorporate digital phase delays or interpolators 620 in the clk4 and clk2 lines controlling the timing of the full wire rate output. Phase adjustment of clocks to slices serving a particular wire allows transmit-side pre-compensation for signal propagation skew, by incrementally advancing or delaying that wire's signals relative to other wire signals. Such transmit-side adjustment facilitates use of receive detectors as taught in Ulrich I. These figures show interpolators 620 adjusting the clock signals provided to all slices driving an output wire, as a straightforward illustration of adjustment for signal propagation skew. Other embodiments may incorporate such clock phase or interpolation adjustment near or within each slice or subset of slices, either to allow compensation for clock propagation delays within the chip itself, or to permit incremental adjustment of timing between individual slices driving the same output.

The necessary adjustment information may be obtained by external testing of the signal paths, or through feedback of receiver information to the transmitter. Another example of transmitter compensation for receiver skew is shown in Holden I.

Given sufficient delay capabilities within the FIR FIFOs and sufficient slice input multiplexer flexibility, encoded signals going to particular wire outputs may not only be offset by a portion of a unit interval relative to other wire outputs, but may also be offset by more than one unit interval relative to other wire outputs, by utilizing main outputs representing different FIFO delay amounts than that provided to other wire outputs. As an example, a FIR FIFO storing a total of eight taps (i.e. eight wire rate transmission intervals) of history may be configured to output a one UI advanced pre-output, a main output, and one UI delayed and two UI delayed post-outputs, with the pre- and post-outputs used for FIR filtering of the output waveform. If these FIFO outputs are taken, as examples, from the second, third, fourth, and fifth taps respectively, and an equivalent FIFO servicing a different wire output utilizes the fourth, fifth, sixth, and seventh taps, the first wire output will be advanced (pre-skew compensated) by two UI intervals, relative to the second wire output. This two UI offset may then be incrementally adjusted by an additional fraction of a UI, by setting the phase interpolators on the clk signals to the first wire's slices to a different value than the phase interpolators on the clk signals to the second wire's slices.

The examples presented herein illustrate the use of vector signaling codes carried by matched impedance parallel transmission line interconnections for chip-to-chip communication. However, those exemplary details should not been seen as limiting the scope of the described invention. The methods disclosed in this application are equally applicable to other interconnection topologies and other communication media including optical, capacitive, inductive, and wireless communications which may rely on any of the characteristics of the described invention, including but not limited to communications protocol, signaling methods, and physical interface characteristics. Thus, descriptive terms such as "voltage" or "signal level" should be considered to include equivalents in other measurement systems, such as "current", "optical intensity", "RF modulation", etc. As used herein, the term "signal" includes any suitable behavior and/or attribute of a physical phenomenon capable of conveying information. The information conveyed by such signals may be tangible and non-transitory.

I claim:

1. An apparatus comprising:
   a data buffer having a post-cursor tap output, a main tap output, and a precursor tap output, configured to provide data bits corresponding to a sequentially generated prior data symbol, present data symbol, and subsequent data symbol, respectively;
   a plurality of wire-specific output driver circuits configured to generate an output signal on a corresponding wire of a multi-wire bus, the output signal comprising a weighted summation of a post-cursor signal component, a main signal component, and a precursor signal component, the plurality of wire-specific output driver circuits comprising:
      a first subset of output driver circuits having a signal selection input connected to the post-cursor tap output, the post-cursor signal component based on the data bits corresponding to the prior data symbol, the post-cursor signal component having a weight determined by a number of output driver circuits in the first subset of output driver circuits;
      a second subset of output driver circuits having a signal selection input connected to the main tap output, and configured to generate the main signal component based on the data bits corresponding to the present data symbol, the main signal component having a weight determined by a number of output driver circuits in the second subset of output driver circuits;
      a third subset of output driver circuits having a signal selection input connected to the precursor tap output, and configured to generate the precursor signal component based on the data bits corresponding to the subsequent data symbol, the precursor signal component having a weight determined by a number of output driver circuits in the third subset of output driver circuits;
   a plurality of resistive impedances, each resistive impedance configured to connect an output of a respective output driver circuit of the plurality of wire-specific output driver circuits to the corresponding wire of the multi-wire bus, and wherein a total output impedance is determined according to a total number of output driver circuits in the plurality of wire-specific output driver circuits.

2. The apparatus of claim 1, wherein each wire of the multi-wire bus has a corresponding plurality of wire-specific output driver circuits.

3. The apparatus of claim 1, wherein the plurality of wire-specific output drivers comprises a fourth subset of output driver circuits having a signal selection input connected to a fixed input value.

4. The apparatus of claim 1, wherein the plurality of wire-specific output drivers comprises a fourth subset of output driver circuits set in a high-impedance state.

5. The apparatus of claim 1, wherein the output signal is generated on the corresponding wire of the multi-wire bus according to a transmit clock.

6. The apparatus of claim 5, further comprising an adjustable delay element configured to adjust a timing of the transmit clock with respect to a timing of at least one other wire of the multi-wire bus.

7. The apparatus of claim 1, wherein the total output impedance matches a characteristic impedance of the corresponding wire of the multi-wire bus.

8. The apparatus of claim 1, wherein the prior data symbol, present data symbol, and subsequent data symbol each have a respective value selected from a set of at least three values.

9. The apparatus of claim 1, wherein the prior data symbol, present data symbol, and subsequent data symbol each have a respective value selected from the group consisting of $\{\pm 1, \pm 1/3\}$.

10. The apparatus of claim 1, wherein each output driver circuit of the plurality of wire-specific output driver circuits comprises a respective pre-driver switching circuit configured to connect the signal selection input to the post-cursor tap output, the main tap output, or the precursor tap output.

11. A method comprising:
providing data bits corresponding to a sequentially generated prior data symbol, present data symbol, and subsequent data symbol on a post-cursor tap output, a main tap output, and a precursor tap output, respectively, of a data buffer;
generating an output signal on a corresponding wire of a multi-wire bus using a plurality of wire-specific output driver circuits, the output signal comprising a weighted summation of a post-cursor signal component, a main signal component, and a precursor signal component, wherein generating the output signal comprises:
generating the post-cursor using a first subset of output driver circuits having a signal selection input connected to the post-cursor tap output, the post-cursor signal component based on the data bits corresponding to the prior data symbol and having a weight determined by a number of output driver circuits in the first subset of output driver circuits;
generating the main signal component using a second subset of output driver circuits having a signal selection input connected to the main tap output, the main signal component based on the data bits corresponding to the present data symbol and having a weight determined by a number of output driver circuits in the second subset of output driver circuits;
generating the precursor signal component using a third subset of output driver circuits having a signal selection input connected to the precursor tap output, the precursor signal component based on the data bits corresponding to the subsequent data symbol and having a weight determined by a number of output driver circuits in the third subset of output driver circuits;
wherein each output driver circuit of the plurality of wire-specific output driver circuits is connected to the corresponding wire of the multi-wire bus via a respective resistive impedance, and wherein the total output impedance is determined according to a total number of output driver circuits in the plurality of wire-specific output driver circuits.

12. The method of claim 11, further comprising generating a respective output signal on each wire of the multi-wire bus using a corresponding plurality of wire-specific output driver circuits.

13. The method of claim 11, wherein weighted summation further comprises an offset component generated using a fourth subset of output driver circuits having a signal selection input connected to a fixed input value.

14. The method of claim 11, further comprising setting a fourth subset of output driver circuits in a high-impedance state.

15. The method of claim 11, wherein the output signal is generated on the corresponding wire of the multi-wire bus according to a transmit clock.

16. The method of claim 15, further comprising adjusting a timing of the transmit clock with respect to a timing of at least one other wire of the multi-wire bus.

17. The method of claim 11, wherein the total output impedance matches a characteristic impedance of the corresponding wire of the multi-wire bus.

18. The method of claim 11, wherein the prior data symbol, present data symbol, and subsequent data symbol each have a respective value selected from a set of at least three values.

19. The method of claim 11, wherein the prior data symbol, present data symbol, and subsequent data symbol each have a respective value selected from the group consisting of $\{\pm 1, \pm 1/3\}$.

20. The method of claim 11, wherein each output driver circuit of the plurality of wire-specific output driver circuits is selectably connected via the signal selection input to the post-cursor tap output, the main tap output, or the precursor tap output using a respective pre-driver switching circuit.

* * * * *